(12) United States Patent
Tago et al.

(10) Patent No.: US 10,231,342 B2
(45) Date of Patent: Mar. 12, 2019

(54) COMPONENT BUILT-IN SUBSTRATE

(71) Applicant: Murata Manufacturing Co., Ltd., Nagaokakyo-shi, Kyoto-fu (JP)

(72) Inventors: Shigeru Tago, Nagaokakyo (JP); Hirofumi Shinagawa, Nagaokakyo (JP); Yuki Wakabayashi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/487,547

(22) Filed: Apr. 14, 2017

(65) Prior Publication Data

US 2017/0223837 A1  Aug. 3, 2017

Related U.S. Application Data

(63) Continuation of application No. PCT/JP2015/079773, filed on Oct. 22, 2015.

(30) Foreign Application Priority Data

Nov. 17, 2014 (JP) .................................. 2014-232890

(51) Int. Cl.
*H05K 5/00* (2006.01)
*H05K 7/00* (2006.01)
(Continued)

(52) U.S. Cl.
CPC ......... *H05K 1/186* (2013.01); *H01L 23/5389* (2013.01); *H05K 1/0313* (2013.01);
(Continued)

(58) Field of Classification Search
CPC ...... H05K 1/185; H05K 2201/10; H05K 1/11; H05K 1/024; H05K 1/03; H05K 1/036;
(Continued)

(56) References Cited

U.S. PATENT DOCUMENTS

| 7,649,252 B2 * | 1/2010 | Sakai ................. H01L 23/5385 257/700 |
| 2008/0149374 A1 | 6/2008 | Harada et al. |
| 2013/0182401 A1 * | 7/2013 | Furutani .............. H05K 1/0296 361/782 |

FOREIGN PATENT DOCUMENTS

| JP | 2008-160042 A | 7/2008 |
| JP | 2013-165166 A | 8/2013 |
| JP | 2013-211431 A | 10/2013 |

OTHER PUBLICATIONS

Official Communication issued in International Patent Application No. PCT/JP2015/079773, dated Dec. 28, 2015.

* cited by examiner

*Primary Examiner* — Binh B Tran

(74) *Attorney, Agent, or Firm* — Keating & Bennett, LLP

(57) ABSTRACT

A component built-in substrate incorporates a chip capacitor in a multilayer substrate including laminated base material layers made of thermoplastic resin. The chip capacitor includes an uneven portion including a recessed portion and a projected portion on one side in a laminated direction. On one side of the chip capacitor in the multilayer substrate, a density of low fluid member with a melting point higher than a fluidization temperature of the base material layers is higher in a region overlapping the recessed portion of the chip capacitor than in a region overlapping the projected portion of the chip capacitor when viewed in the lamination direction.

15 Claims, 12 Drawing Sheets

(51) Int. Cl.
*H05K 1/18* (2006.01)
*H01L 23/538* (2006.01)
*H05K 1/03* (2006.01)
*H05K 1/09* (2006.01)
*H05K 1/11* (2006.01)
*H05K 3/46* (2006.01)
*H05K 1/16* (2006.01)
*H05K 1/02* (2006.01)

(52) U.S. Cl.
CPC ............... *H05K 1/09* (2013.01); *H05K 1/111* (2013.01); *H05K 1/185* (2013.01); *H05K 3/4626* (2013.01); *H05K 3/4644* (2013.01); H01L 2224/16225 (2013.01); H01L 2924/0002 (2013.01); H01L 2924/19105 (2013.01); H05K 1/024 (2013.01); H05K 1/03 (2013.01); H05K 1/11 (2013.01); H05K 1/165 (2013.01); H05K 2201/0129 (2013.01); H05K 2201/10 (2013.01); H05K 2201/10015 (2013.01); H05K 2201/10098 (2013.01); H05K 2203/063 (2013.01)

(58) Field of Classification Search
CPC ................... H05K 1/165; H05K 1/167; H05K 2201/10007; H05K 2201/10015; H05K 2201/10022
USPC .......................... 361/760–783; 174/250, 251
See application file for complete search history.

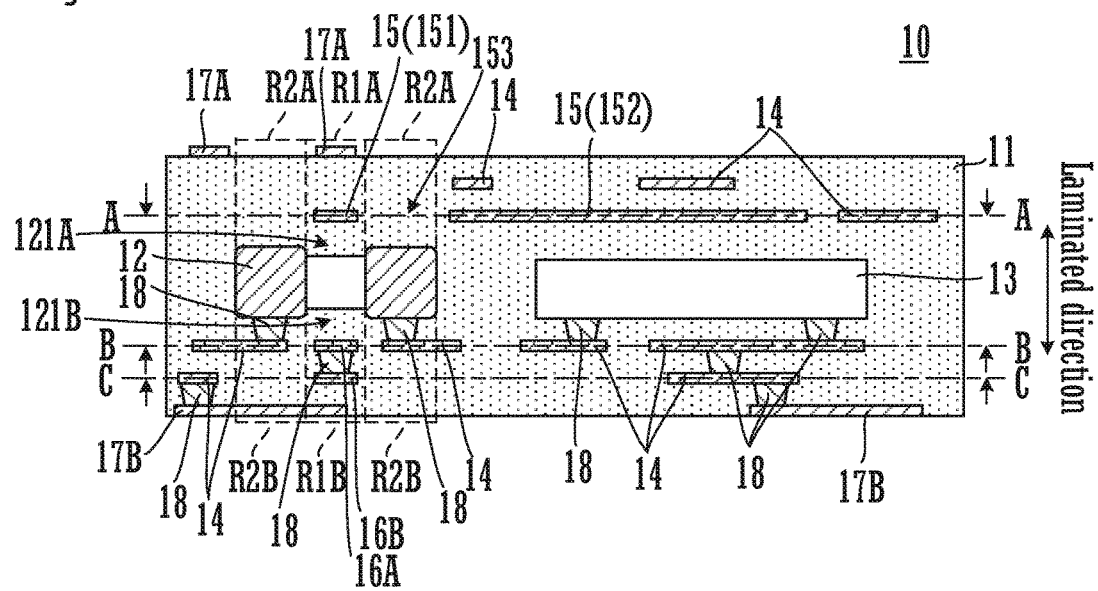

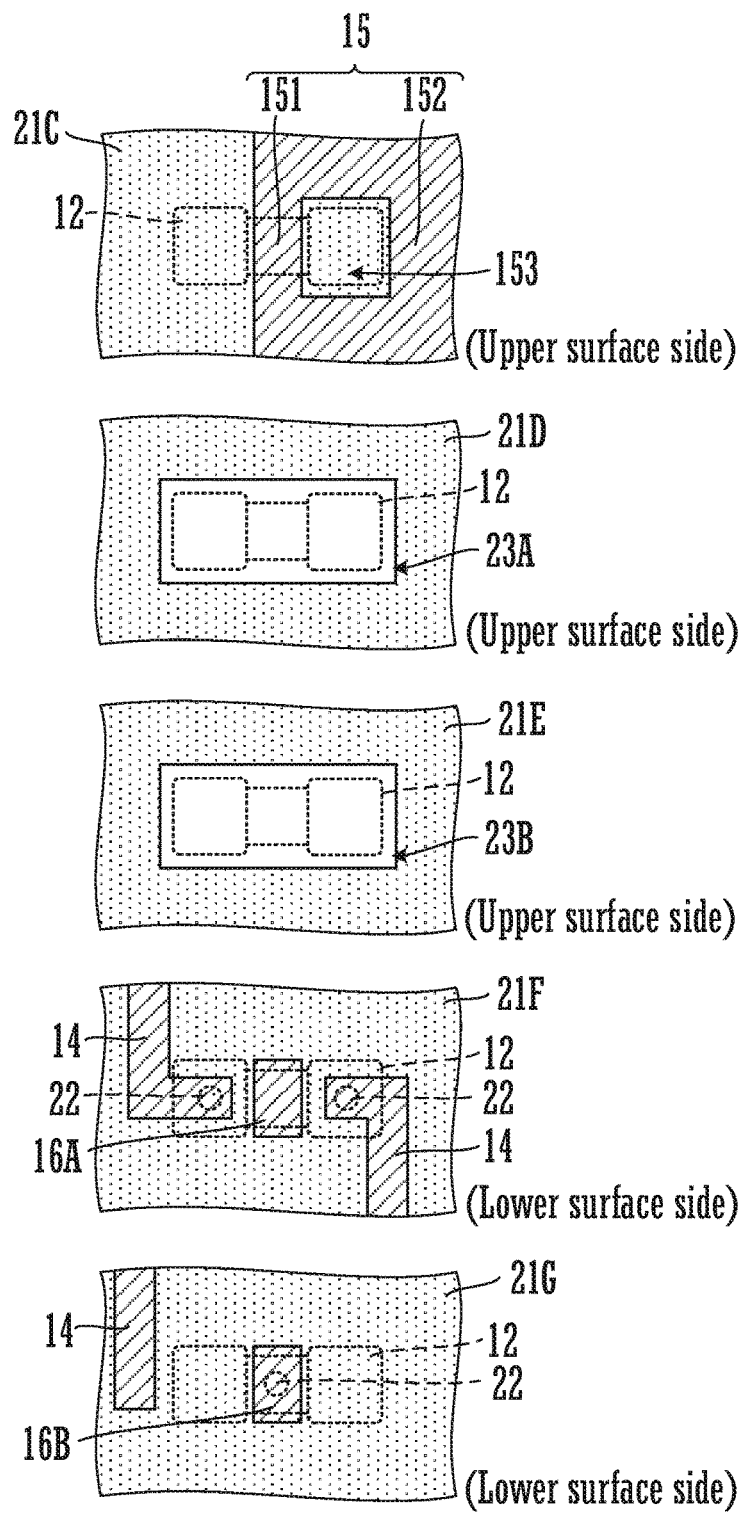

ated base material layers are hot-pressed, a pressure of the fluidized thermoplastic resin is higher in the first region than in the second region. Thus, a portion of the fluidized thermoplastic resin in the first region with higher pressure flows into the recessed portion of the component such that the likelihood of the position of the component being shifted is significantly reduced or eliminated. Thus, the positional precision of the component is significantly increased.
COMPONENT BUILT-IN SUBSTRATE

CROSS REFERENCE TO RELATED APPLICATIONS

This application claims the benefit of priority to Japanese Patent Application No. 2014-232890 filed on Nov. 17, 2014 and is a Continuation Application of PCT Application No. PCT/JP2015/079773 filed on Oct. 22, 2015. The entire contents of each application are hereby incorporated herein by reference.

BACKGROUND OF THE INVENTION

1. Field of the Invention

The present invention relates to a component built-in substrate incorporating a component in a multilayer substrate including laminated base material layers made of thermoplastic resin, and a method for manufacturing the same.

2. Description of the Related Art

Conventional component built-in substrates include a component built-in multilayer printed board disclosed in Unexamined Japanese Patent Publication No. 2013-165166, for example. According to the component built-in multilayer printed board, an opening is provided in a prepreg sheet sandwiched between a first metal-clad laminate sheet and a second metal-clad laminate sheet, and a built-in component is accommodated in the opening. Here, the component built-in multilayer printed board is manufactured as follows. First, the built-in component is mounted on an insulation base material of the first metal-clad laminate sheet. Next, the first metal-clad laminate sheet, the prepreg sheet, and the second metal-clad laminate sheet are overlapped so that the built-in component is accommodated in the opening of the prepreg sheet, and then they are lamination-pressed (heated and pressed).

According to the component built-in multilayer printed board disclosed in Unexamined Japanese Patent Publication No. 2013-165166, when the insulation base material and the prepreg sheet are made of thermoplastic resin, because the thermoplastic resin is fluidized in the lamination-pressing step, the likelihood of the position of the built-in component being shifted is significantly increased.

SUMMARY OF THE INVENTION

Preferred embodiments of the present invention provide a component built-in substrate in which positional precision of a built-in component is significantly increased, even when a base material layer is made of thermoplastic resin, and a method for manufacturing the same.

A component built-in substrate according to a preferred embodiment of the present invention incorporates a component in a multilayer substrate including laminated base material layers made of thermoplastic resin. The component disposed in the multilayer substrate includes an uneven portion including a recessed portion and a projected portion on at least one side in a lamination direction. On at least one side of the component in the multilayer substrate, a density of a low fluid member with a melting point higher than a fluidization temperature of the base material layer is higher in a first region overlapping the recessed portion of the component than in a second region overlapping the projected portion of the component when viewed in the lamination direction.

In this configuration, the density of the low fluid member in the first region is higher than the density of the low fluid member in the second region on at least one side of the component in the multilayer substrate. Consequently, when the lamin In a component built-in substrate according to a preferred embodiments of the present invention, it is preferable that on at least one side of the component in the multilayer substrate, at least one portion of the low fluid member located in the first region is closer to the component than to a main surface of the multilayer substrate. In this configuration, the distance between the low fluid member and the recessed portion of the component is short. Therefore, during the hot-pressing step, a portion of the fluidized thermoplastic resin in the first region with higher pressure flows into the recessed portion of the component such that the likelihood of the position of the component being shifted is significantly reduced or eliminated.

In a component built-in substrate according to a preferred embodiments of the present invention, it is preferable that the low fluid member includes a conductor pattern that faces the component across the base material layers. In this configuration, the low fluid member is able to be formed by a method similar to that of a circuit wiring conductor in the multilayer substrate. In addition, the space between the low fluid member including the conductor pattern and the component is filled with the thermoplastic resin such that the low fluid member including the conductor pattern is not directly in contact with an electrode portion of the component. As a result, electric characteristics are prevented from varying due to damage or conduction of the component caused by collision with the low fluid member including the conductor pattern.

In a component built-in substrate according to a preferred embodiment of the present invention, the conductor pattern may include a ground conductor. In this configuration, even when the low fluid member including the ground conductor varies in position and shape to some degree, varying of characteristics of a circuit provided in the component built-in substrate is significantly reduced or eliminated. Furthermore, the low fluid member including the ground conductor is able to be used as a shield member.

In a component built-in substrate according to a preferred embodiment of the present invention, the conductor pattern includes an isolated conductor. In this configuration, similar to above, even when the low fluid member including the isolated conductor varies in position and shape to some degree, varying of characteristics of the circuit provided in the component built-in substrate is significantly reduced or eliminated.

In a component built-in substrate according to a preferred embodiment of the present invention, a conductor pattern may be integrally provided or formed in the first region and in the periphery of the second region to surround the second region when viewed in the lamination direction. In this configuration, even when a cavity to accommodate the component is not provided in the base material layer in steps of manufacturing the component built-in substrate, a space to accommodate the component is able to be provided by the thickness of the conductor pattern. Furthermore, when the conductor pattern is used as the shield member, a periphery of the component is able to be covered with the shield member when viewed in the lamination direction and a shield effect is able to be significantly increased with respect to the component.

A component built-in substrate according to a preferred embodiment of the present invention is preferably configured as follows. The component disposed in the multilayer substrate includes another uneven portion on another side in the lamination direction. On each of the one side and the another side of the component in the multilayer substrate, the density of the low fluid member is higher in the first region than in the second region. In this configuration, during the hot-pressing step, a portion of the fluidized thermoplastic resin in the first region with higher pressure flows into the recessed portion of the component on each side of the component in the lamination direction such that the likelihood of the position of the component being shifted is significantly reduced or eliminated.

A component built-in substrate according to a preferred embodiment of the present invention is configured as follows. The low fluid member in each of the first region and the second region is a conductor pattern. On the one side of the component in the multilayer substrate, a number of laminated base material layers in the first region is equal to a number of laminated base material layers in the second region. On the one side of the component in the multilayer substrate, a difference between a total value of thickness of the low fluid member in the lamination direction in the first region, and a total value of thickness of the low fluid member in the lamination direction in the second region is equal to, substantially equal to, or less than a step difference of the uneven portion of the component. In this configuration, the step difference of the uneven portion of the component is compensated by the low fluid member such that the main surface of the multilayer substrate is flat or substantially flat in the portion overlapping the component when viewed in the lamination direction.

In a component built-in substrate according to a preferred embodiment of the present invention, on the main surface of the multilayer substrate on the one side of the component, an external electrode may be provided in a position overlapping the component when viewed in the lamination direction. In this configuration, when a surface mount substrate is mounted on the external electrode, the surface mount substrate is disposed on the flat or substantially flat main surface, and defects in contact between the external electrode and the surface mount substrate are prevented.

A method for manufacturing a component built-in substrate according to a preferred embodiment of the present invention includes the steps of preparing a plurality of base material layers made of thermoplastic resin; laminating the plurality of base material layers with a component disposed between the plurality of base material layers; and hot-pressing the plurality of laminated base material layers. In the step of laminating the plurality of base material layers, the component is disposed such that an uneven portion including a recessed portion and a projected portion of the component is located on at least one side of the component in a lamination direction of the plurality of base material layers, and at least in the plurality of base material layers laminated on the one side of the component, a low fluid member with a melting point higher than a fluidization temperature of the plurality of base material layers is provided such that a density of the low fluid member is higher in a third region overlapping the recessed portion of the component than in a fourth region overlapping the projected portion of the component when viewed in the lamination direction. In this configuration, as described above, the component built-in substrate in which the positional precision of the component is significantly increased is manufactured.

In a method for manufacturing a component built-in substrate according to a preferred embodiment of the present invention, before the step of laminating the plurality of base material layers, in at least one of the plurality of base material layers laminated on the one side of the component, a portion overlapping the projected portion of the component when viewed in the lamination direction is hollowed out. In this configuration, during the hot-pressing step, a portion of the fluidized thermoplastic resin in the first region with higher pressure flows into the recessed portion of the component such that the likelihood of the position of the component being shifted is significantly reduced or eliminated.

According to various preferred embodiments of the present invention, even when the base material layer of the component built-in substrate is made of thermoplastic resin, the positional precision of the built-in component is able to be significantly increased.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1 is a schematic cross-sectional view of a component built-in substrate according to a first preferred embodiment of the present invention.

FIG. 5 is a schematic plan view illustrating base material layers 21C to 21G near the chip capacitor 12.

DETAILED DESCRIPTION OF THE INVENTION

Figure 2A:
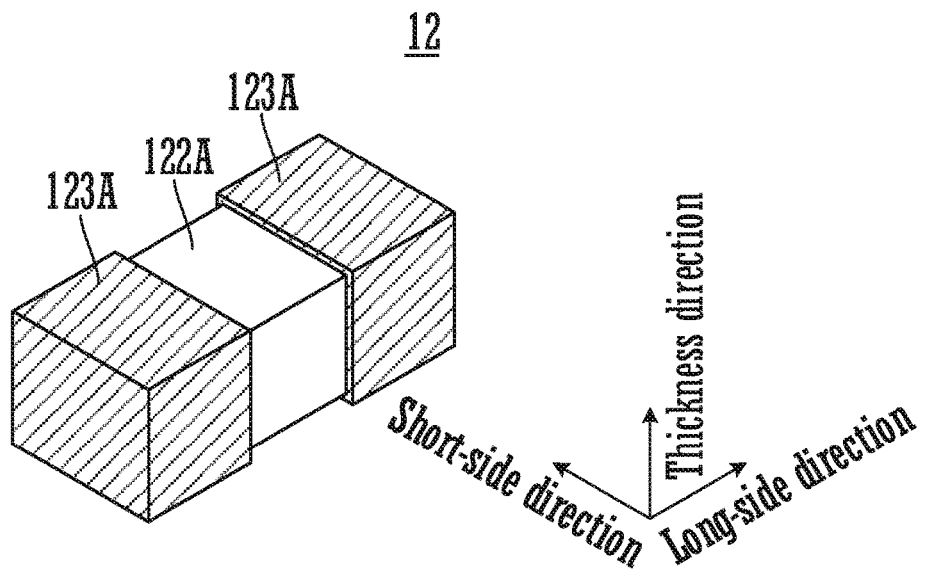
FIG. 2A is a schematic outline perspective view of a chip capacitor 12.

Each preferred embodiment of the present invention is merely one example, and configurations described in the different preferred embodiments may be partially replaced or combined as a matter of course. In the second preferred embodiment and the following preferred embodiments, a description of elements, steps, and features in common with the first preferred embodiment is not given, and only differences from the first preferred embodiment are described. Further, similar functional effects due to the same configuration of elements, steps, and features in the preferred embodiments are not described in every preferred embodiment.

First Preferred Embodiment

A component built-in substrate 10 according to a first preferred embodiment of the present invention will be described. FIG. 1 is a schematic cross-sectional view of the component built-in substrate 10. The component built-in substrate 10 incorporates a chip capacitor 12 and a RFIC (Radio Frequency Integrated Circuit) 13 in a multilayer substrate 11. The multilayer substrate 11 is provided by laminating base material layers made of thermoplastic resin. The chip capacitor 12 is disposed in the multilayer substrate 11 and includes an uneven portion 121A including a recessed portion 122A and a projected portion 123A (refer to FIG. 2B) on one side (upper side) in a lamination direction of the multilayer substrate 11. The chip capacitor 12 disposed in the multilayer substrate 11 includes an uneven portion 121B including a recessed portion 122B and projected portion 123B (refer to FIG. 2B) on the other side (lower side) in the lamination direction of the multilayer substrate 11. The chip capacitor 12 is one non-limiting example of a "component" in various preferred embodiments of the present invention. In addition, FIG. 1 does not illustrate boundaries between the base material layers in the multilayer substrate 11.

A conductor pattern is provided on a main surface of the base material layers of the multilayer substrate 11. The conductor pattern includes a circuit wiring conductor 14, a ground conductor 15, isolated conductors (floating conductors) 16A and 16B, and external electrodes 17A and 17B. An interlayer connection conductor 18 is provided in the base material layers of the multilayer substrate 11. The interlayer connection conductor 18 connects the chip capacitor 12 to the conductor pattern and connects the conductor patterns provided on multiple layers of the base material layers of the multilayer substrate 11 to each other. The conductor pattern and the interlayer connection conductor 18 are an example of a low fluid member. The low fluid member is a member with a melting point higher than a temperature at which the base material layers in the multilayer substrate 11 becomes fluid.

Figure 2B:
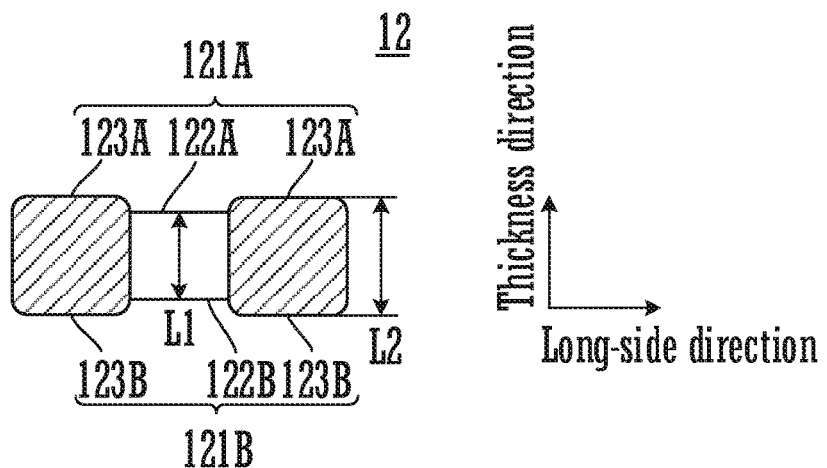
FIG. 2B is a schematic side view of the chip capacitor 12.

FIG. 2A is a schematic outline perspective view of the chip capacitor 12. FIG. 2B is a schematic side view of the chip capacitor 12. The chip capacitor 12 includes a rectangular parallelepiped shape or a substantially rectangular parallelepiped shape. A side surface electrode is provided on each end of the chip capacitor 12 in a long-side direction by laminating a copper plated film or nickel plated film onto the ends of the chip capacitor 12. A thickness L1 of the center of the chip capacitor 12 in the long-side direction is smaller than a thickness L2 of each end of the chip capacitor 12 in the long-side direction. The chip capacitor 12 includes the uneven portion 121A on its one main surface, and the uneven portion 121B on its other main surface.

The uneven portion 121A of the chip capacitor 12 includes the recessed portion 122A located in the center of the chip capacitor 12 in the long-side direction and the projected portion 123A located at each end of the chip capacitor 12 in the long-side direction. The uneven portion 121B of the chip capacitor 12 includes the recessed portion 122B located in the center of the chip capacitor 12 in the long-side direction and the projected portion 123B located at each end of the chip capacitor 12 in the long-side direction.

As illustrated in FIG. 1, on the upper side of the chip capacitor 12 in the multilayer substrate 11, a region overlapping the recessed portion 122A (refer to FIG. 2B) of the chip capacitor 12 when viewed in the lamination direction is defined as a region R1A, and a region overlapping the projected portion 123A of the chip capacitor 12 when viewed in the lamination direction is defined as a region R2A. The region R1A is one non-limiting example of a "first region" according to various preferred embodiments of the present invention. The region R2A is one non-limiting example of a "second region" according to various preferred embodiments of the present invention. A density of the low fluid members is higher in the region R1A than in the region R2A. Here, the density of the low fluid members in a region is a ratio of a volume of the low fluid members in that region to a volume of that region.

The ground conductor 15 faces the chip capacitor 12 across the base material layers of the multilayer substrate 11. The thermoplastic resin of the base material layers of the multilayer substrate 11 fills a space between the ground conductor 15 and the uneven portion 121A of the chip capacitor 12. At least one of the base material layers of the multilayer substrate 11 is disposed between the ground conductor 15 and the chip capacitor 12. The ground conductor 15 is closer to the uneven portion 121A of the chip capacitor 12 than to an upper surface of the multilayer substrate 11. The ground conductor 15 is closer to the uneven portion 121A of the chip capacitor 12 than a middle point between the upper surface of the multilayer substrate 11 and the uneven portion 121A of the chip capacitor 12 in the laminated direction. On the upper side of the chip capacitor 12 in the multilayer substrate 11, at least one portion of the ground conductor 15 located in the region R1A is disposed such that a distance from the at least one portion of the ground conductor 15 to the chip capacitor 12 is smaller than a distance from the at least one portion of the ground conductor 15 to the main surface of the multilayer substrate 11.

On the lower side of the chip capacitor 12 in the multilayer substrate 11, a region overlapping the recessed portion 122B (refer to FIG. 2B) of the chip capacitor 12 when viewed in the lamination direction is defined as a region R1B, and a region overlapping the projected portion 123B of the chip capacitor 12 when viewed in the lamination direction is defined as a region R2B. The region R1B is one non-limiting example of a "first region" according to various preferred embodiments of the present invention. The region R2B is one non-limiting example of a "second region" according to various preferred embodiments of the present invention. A density of the low fluid members is higher in the region R1B than in the region R2B.

The isolated conductors 16A and 16B face the chip capacitor 12 across the base material layers of the multilayer substrate 11. At least one of the base material layers of the multilayer substrate 11 is disposed between the isolated conductor 16A and the chip capacitor 12. The isolated conductor 16A is closer to the uneven portion 121B of the chip capacitor 12 than to a lower surface of the multilayer substrate 11. The isolated conductor 16A and the isolated conductor 16B are connected through the interlayer connection conductor 18.

The low fluid member in each of the regions R1A and R2A is the conductor pattern. The number of laminated base material layers of the multilayer substrate 11 in the region R1A is preferably equal to the number of laminated base material layers of the multilayer substrate 11 in the region R2A (see, for example, R1C and R2C in FIG. 4B). A difference between a total value of thicknesses of the low fluid members in the lamination direction in the region R1A and a total value of thicknesses of the low fluid members in the laminated direction in the region R2A is equal to or substantially equal to a step difference of the uneven portion 121A of the chip capacitor 12. For example, as illustrated in FIG. 1, the conductor patterns are provided on two of the base material layers in the region R1A, while the conductor pattern is not provided in the region R2A. When the step difference of the uneven portion 121A of the chip capacitor 12 is about 12 µm, the thickness of the conductor pattern is about 6 µm, for example. Furthermore, the above difference may be equal to, substantially equal to, smaller than, or substantially smaller than the step difference of the uneven portion 121A of the chip capacitor 12.

Figure 3A:
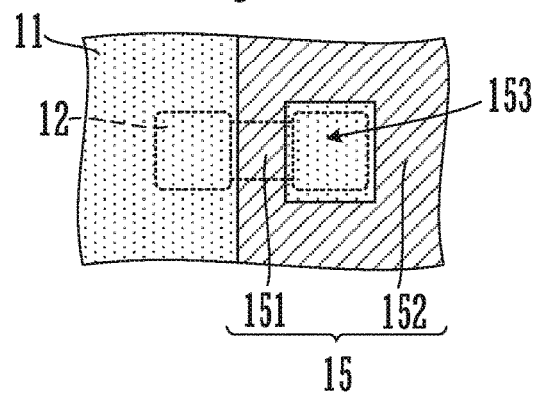
FIG. 3A is a schematic A-A cross-sectional view illustrating a positional relation between the chip capacitor 12 and a ground conductor 15.
Figure 3B:
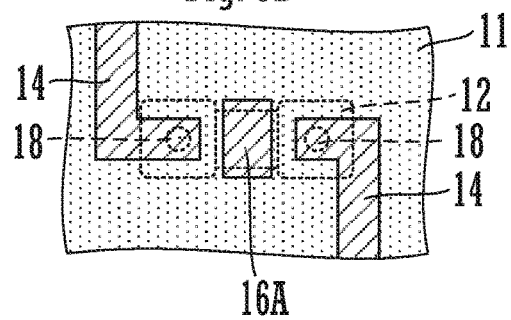
FIG. 3B is a schematic B-B cross-sectional view illustrating a positional relation between the chip capacitor 12 and an isolated conductor 16A.
Figure 3C:
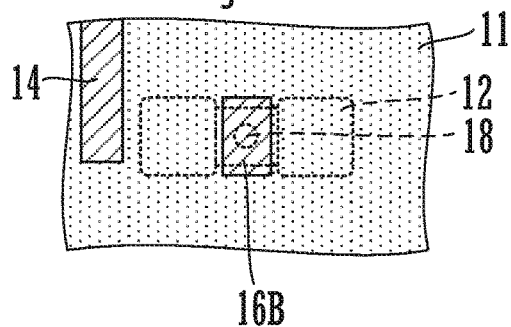
FIG. 3C is a schematic C-C cross-sectional view illustrating a positional relation between the chip capacitor 12 and an isolated conductor 16B.

FIG. 3A is a schematic A-A cross-sectional view illustrating a positional relationship between the chip capacitor 12 and the ground conductor 15. FIG. 3B is a schematic B-B cross-sectional view illustrating a positional relationship between the chip capacitor 12 and the isolated conductor 16A. FIG. 3C is a schematic C-C cross-sectional view illustrating a positional relationship between the chip capacitor 12 and the isolated conductor 16B.

The ground conductor 15 is provided preferably by integrally forming a first conductor portion 151 overlapping the recessed portion 122A of the chip capacitor 12 in planar view (viewed in the lamination direction), and a plate-shaped second conductor portion 152. The first conductor portion 151, as illustrated in FIG. 3A, overlaps the recessed portion 122A (refer to FIG. 2B) of the chip capacitor 12 in the planar view but does not overlap the projected portion 123A of the chip capacitor 12 in the planar view. The first conductor portion 151 has a rectangular plate shape or a substantially rectangular plate shape, and is disposed such that a short-side direction of the first conductor portion 151 is a direction along the long-side direction of the chip capacitor 12. The first conductor portion 151 is slightly shorter than the recessed portion 122A of the chip capacitor 12 in the long-side direction of the chip capacitor 12. The first conductor portion 151 is longer than the recessed portion 122A of the chip capacitor 12 in the short-side direction of the chip capacitor 12. The ground conductor 15 includes a rectangular or substantially rectangular opening 153. One of the projected portions 123A of the chip capacitor 12 is disposed inside of the opening 153 of the ground conductor 15 in the planar view.

As illustrated in FIG. 3B, the isolated conductor 16A overlaps the recessed portion 122B of the chip capacitor 12 in the planar view but does not overlap the projected portion 123B of the chip capacitor 12 in the planar view. The isolated conductor 16A has a rectangular or substantially rectangular plate shape, and is disposed such that a short-side direction of the isolated conductor 16A is a direction along the long-side direction of the chip capacitor 12. The isolated conductor 16A is slightly shorter than the recessed portion 122B of the chip capacitor 12 in the long-side direction of the chip capacitor 12. The isolated conductor 16A is longer than the recessed portion 122B of the chip capacitor 12 in the short-side direction of the chip capacitor 12. The isolated conductor 16B is located to align or substantially align with the isolated conductor 16A in the planar view.

Figure 4A:
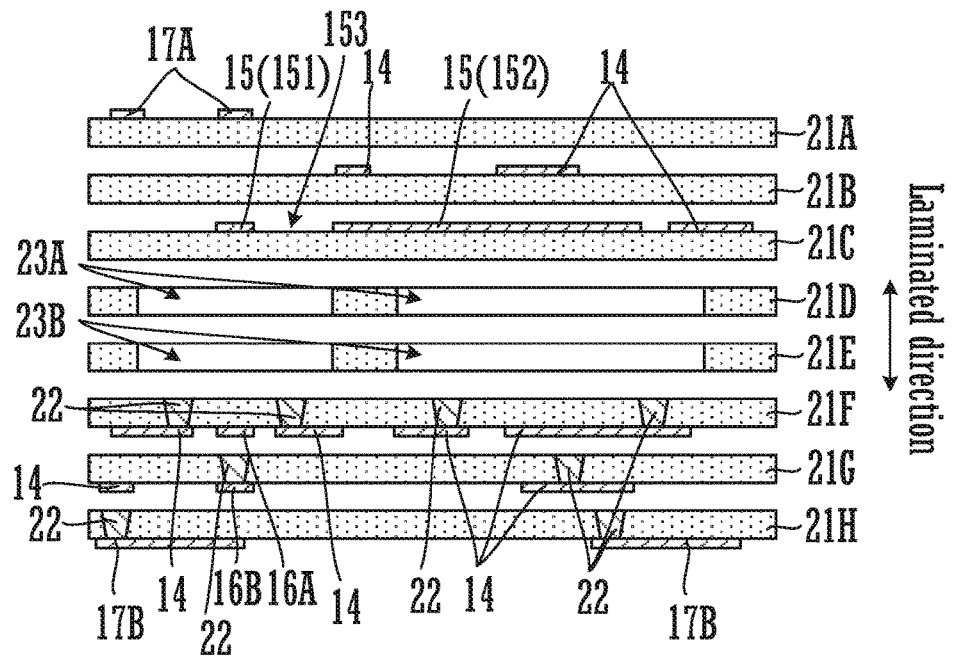
FIG. 4A and FIG. 4B are schematic cross-sectional views illustrating a method for manufacturing the component built-in substrate according to the first preferred embodiment of the present invention.
Figure 4B:
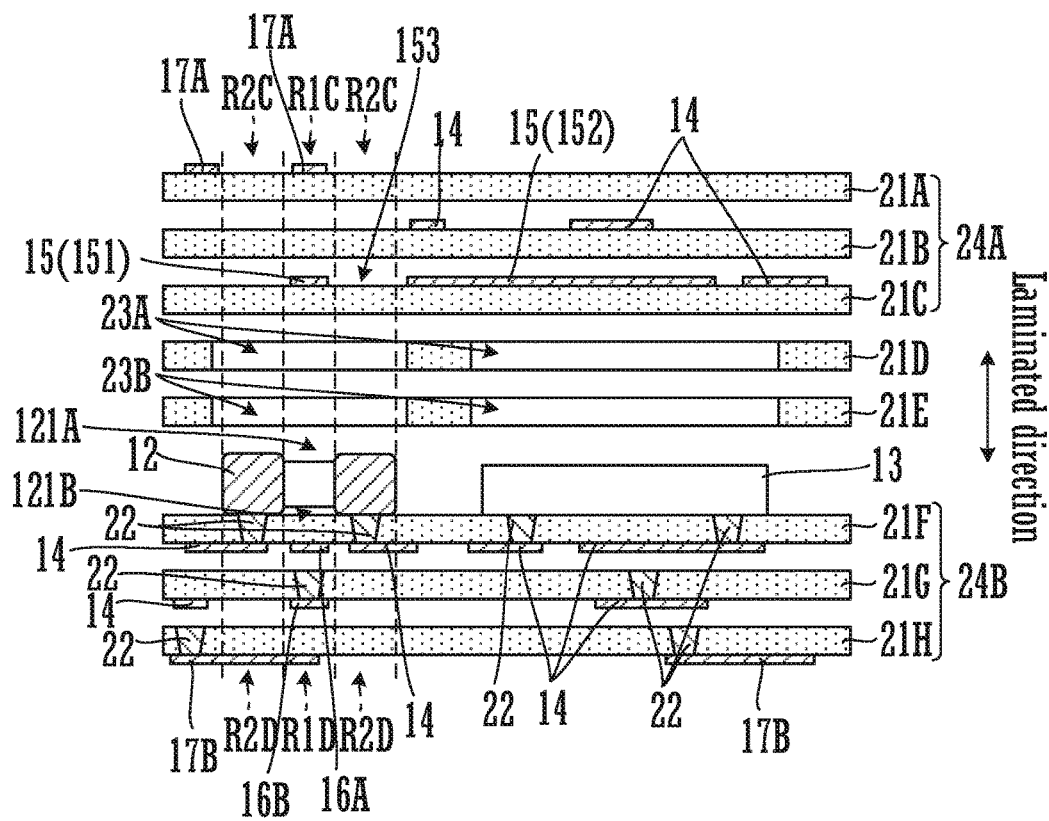

FIGS. 4A and 4B are schematic cross-sectional views illustrating a method for manufacturing the component built-in substrate 10. FIG. 5 is a schematic plan view illustrating base material layers 21C to 21G near the chip capacitor 12. First, each of the base material layers 21A to 21H is completely covered by conductor foil formed on one surface of each of the base material layers 21A to 21H. Next, the conductor patterns are formed by patterning the conductor foil on some of the base material layers 21A to 21H by etching or a similar technique. The base material layers 21A to 21H are made of a thermoplastic resin such as liquid crystal polymer (LCP). The conductor foil of the base material layers 21A to 21H is copper foil or a similar metal foil.

As illustrated in FIG. 4B, the base material layers 21A to 21C laminated on the upper side of the chip capacitor 12 are referred to as a laminated body 24A. In the laminated body 24A, a region overlapping the recessed portion 122A (refer to FIG. 2B) of the chip capacitor 12 when viewed in the lamination direction is defined as a region R1C. In the laminated body 24A, a region overlapping the projected portion 123A of the chip capacitor 12 when viewed in the lamination direction is defined as a region R2C. A density of the low fluid members is higher in the region R1C than in the region R2C. The region R1C is one non-limiting example of a "third region" according to various preferred embodiments of the present invention, and the region R2C is one non-limiting example of a "fourth region" according to various preferred embodiments of the present invention.

Similarly, the base material layers 21F to 21H laminated on the lower side of the chip capacitor 12 are referred to as a laminated body 24B. In the laminated body 24B, a region overlapping the recessed portion 122B of the chip capacitor 12 when viewed in the laminated direction is defined as a region R1D. In the laminated body 24B, a region overlapping the projected portion 123B of the chip capacitor 12 when viewed in the lamination direction is defined as a region R2D. A density of the low fluid members is higher in the region R1D than in the region R2D. The region R1D is one non-limiting example of a "third region" according to various preferred embodiments of the present invention, and the region R2D is one non-limiting example of a "fourth region" according to various preferred embodiments of the present invention.

Furthermore, a via-hole is formed in a position where the interlayer connection conductor 18 is formed (refer to FIG. 1) such that the via-hole penetrates each of the base material layers 21A to 21H but does not penetrate the conductor pattern. After that, the via-hole is filled with a conductive paste 22. The conductive paste 22 is made of a conductive material containing copper or tin as a major component. In addition, rectangular or substantially rectangular through-holes 23A and 23B are formed in the base material layers 21D and 21E by punch-out cutting or a similar technique. Thus, as illustrated in FIG. 4A, the conductor patterns and the like are formed in the base material layers 21A to 21H.

In a following step, as illustrated in FIGS. 4B and 5, the chip capacitor 12 and the RFIC 13 are disposed on an upper surface of the base material layer 21F, then the base material layers 21A to 21H are laminated in this order. That is, the base material layers 21A to 21H are laminated after the chip capacitor 12 and the RFIC 13 have been disposed between the base material layer 21C and the base material layer 21F. At this time, the chip capacitor 12 is disposed such that the uneven portion 121A of the chip capacitor 12 is located on the upper side of the chip capacitor 12. Furthermore, the main surfaces of the base material layers 21A to 21C are arranged such that the conductor patterns of the base material layers 21A to 21C face upward while the main surfaces of the base material layers 21F to 21H are arranged such that the conductor patterns of the base material layers 21F to 21H face downward. The chip capacitor 12 and the RFIC 13 are accommodated in a cavity formed by connecting the through-hole 23A and the through-hole 23B. The chip capacitor 12 disposed between the base material layer 21C and the base material layer 21F includes the uneven portions 121A and 121B in the lamination direction.

In a following step, the laminated base material layers 21A to 21H are heated and pressed simultaneously (hot pressing), such that the base material layers 21A to 21H are thermocompression-bonded to each other. In addition, during the hot-pressing step, the conductive paste 22 is hardened, such that the interlayer connection conductor 18 is formed and connected to the chip capacitor 12 and the conductor pattern. Furthermore, a space around the chip capacitor 12 is filled with fluid thermoplastic resin. Through the above steps, as illustrated in FIG. 1, the component built-in substrate 10 incorporating the chip capacitor 12 and the RFIC 13 in the multilayer substrate 11 is completed.

Figure 6:
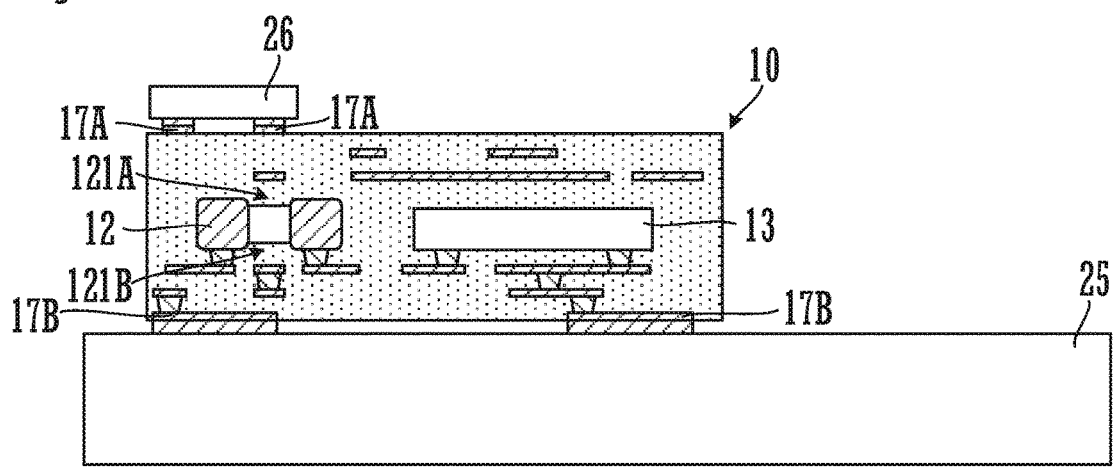
FIG. 6 is a schematic cross-sectional view illustrating a mounted state of the component built-in substrate according to the first preferred embodiment of the present invention.

FIG. 6 is a schematic cross-sectional view illustrating a mounted state of the component built-in substrate 10. The component built-in substrate 10 is mounted on a mount electrode on a mother substrate 25 through the external electrode 17B. A surface mount substrate 26 is mounted on the external electrode 17A of the component built-in substrate 10. The component built-in substrate 10 on which the surface mount substrate 26 is mounted defines and functions as a communication module, for example. The external electrode 17A is provided on the upper surface of the multilayer substrate 11 in a position overlapping the chip capacitor 12 when viewed in the lamination direction. The external electrode 17B is provided on the lower surface of the multilayer substrate 11.

In the first preferred embodiment, the density of the low fluid members in the region R1A is higher than the density of the low fluid members in the region R2A. Thus, during the hot-pressing step, a pressure of the fluidized thermoplastic resin is higher in the region R1C than in the region R2C, and higher in the region R1D than in the region R2D. That is, portions of the fluidized thermoplastic resin in the regions R1C and R1D with higher pressure flow into the recessed portions 122A and 122B of the chip capacitor 12 such that the likelihood of the position of the component being shifted is significantly reduced or eliminated. Thus, positional precision of the component is significantly increased.

Furthermore, the first conductor portion 151 of the ground conductor 15 is disposed near the recessed portion 122A of the chip capacitor 12. The isolated conductor 16A is disposed near the recessed portion 122B of the chip capacitor 12. As a result, during the hot-pressing step, the portions of the fluidized thermoplastic resin in the first regions R1C and R1D with higher pressure flow into the recessed portions 122A and 122B of the chip capacitor 12 such that the likelihood of the position of the component being shifted is significantly reduced or eliminated.

Furthermore, the number of laminated base material layers of the multilayer substrate 11 in the region R1A is preferably equal to the number of laminated base material layers of the multilayer substrate 11 in the region R2A. Furthermore, the difference between the total value of the thicknesses of the conductor patterns in the region R2A and the total value of the thicknesses of the conductor patterns in the region R1A is almost equal to the step difference of the uneven portion 121A of the chip capacitor 12. That is, during the steps of manufacturing the component built-in substrate 10, the laminated body 24A is thicker in the region R1C than in the region R2C by the step difference of the uneven portion 121A of the chip capacitor 12. Therefore, the step difference of the uneven portion 121A of the chip capacitor 12 is compensated by the conductor patterns such that flatness is ensured in a portion of the upper surface of the multilayer substrate 11 overlapping the chip capacitor 12 in the planar view.

Furthermore, the external electrode 17A is provided in the portion of the upper surface of the multilayer substrate 11 overlapping the chip capacitor 12 in the planar view. Therefore, when the surface mount substrate 26 is mounted on the external electrode 17A, the surface mount substrate 26 is disposed on a surface that is flat or substantially flat and defects in the connection between the external electrode 17A and the surface mount substrate 26 are prevented or significantly reduced.

Second Preferred Embodiment

A component built-in substrate according to a second preferred embodiment of the present invention will be described. In the component built-in substrate according to the second preferred embodiment, a difference between a total value of thicknesses of the conductor patterns in the region R2A and a total value of thicknesses of the conductor patterns in the region R1A is smaller than the step difference of the uneven portion 121A of the chip capacitor 12 (refer to FIG. 1). For example, the conductor patterns are provided as illustrated in FIG. 1, the step difference of the uneven portion 121A of the chip capacitor 12 is about 12 μm, and the thickness of the conductor patterns is about 4 μm. Other configurations of the component built-in substrate according to the second preferred embodiment are similar to the configurations of the component built-in substrate 10.

Figure 7:
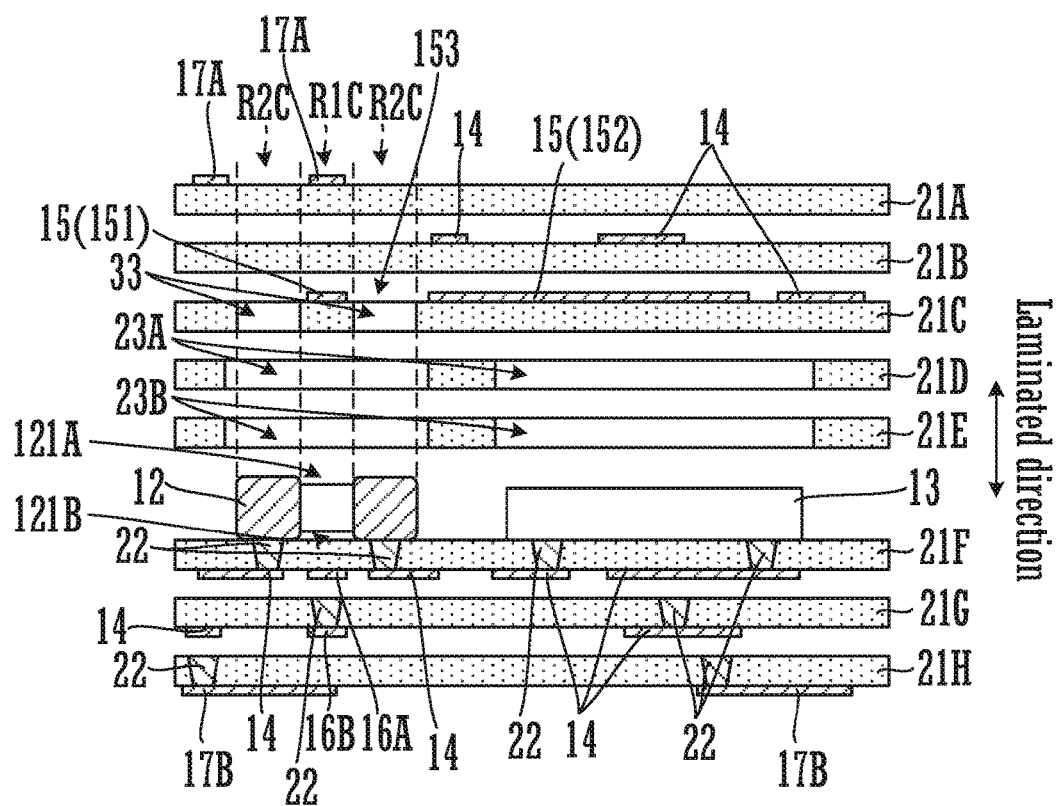
FIG. 7 is a schematic cross-sectional view illustrating a method for manufacturing a component built-in substrate according to a second preferred embodiment of the present invention.

FIG. 7 is a schematic cross-sectional view illustrating a method for manufacturing the component built-in substrate according to the second preferred embodiment. In the second preferred embodiment, when the through-holes 23A and 23B are formed in the base material layers 21D and 21E, a through-hole 33 is formed in a portion of the base material layer 21C overlapping the projected portion 123A (refer to FIG. 2B) of the chip capacitor 12 in the planar view. That is, before the step of laminating the base material layers 21A to 21H, the portion overlapping the projected portion 123A of the chip capacitor 12 when viewed in the lamination direction is hollowed out in the base material layer 21C to be laminated on the upper side of the chip capacitor 12. During the hot-pressing step, the through-hole 33 of the base material layer 21C is filled with fluid thermoplastic resin.

In the second preferred embodiment, as described above, the through-hole 33 is formed in the base material layer 21C. Therefore, during the hot-pressing step, the portion of the base material layer 21C overlapping the recessed portion 122A of the chip capacitor 12 in the planar view, that is, the portion of fluidized thermoplastic resin in the first region R1C with higher pressure flows into the recessed portion of the component. Therefore, the chip capacitor 12 is further prevented from being shifted in position.

In addition, as described above, the difference between the total value of the thicknesses of the conductor patterns in the region R2A and the total value of the thicknesses of the conductor patterns in the region R1A is smaller than the step difference of the uneven portion 121A of the chip capacitor 12. Further, the thickness of the multilayer substrate 11 is adjusted by the through-hole 33 provided in the base material layer 21C, so that the upper surface of the multilayer substrate 11 achieves significantly increased flatness in the portion overlapping the chip capacitor 12 in the planar view.

Third Preferred Embodiment

A component built-in substrate according to a third preferred embodiment of the present invention will be described. In the component built-in substrate according to the third preferred embodiment, the conductor patterns are provided not only in the region overlapping the recessed portion of the chip capacitor in the planar view but also in a periphery of the chip capacitor. Furthermore, during the manufacturing steps, a cavity to accommodate the chip capacitor is not formed in the base material layers.

Figure 8:
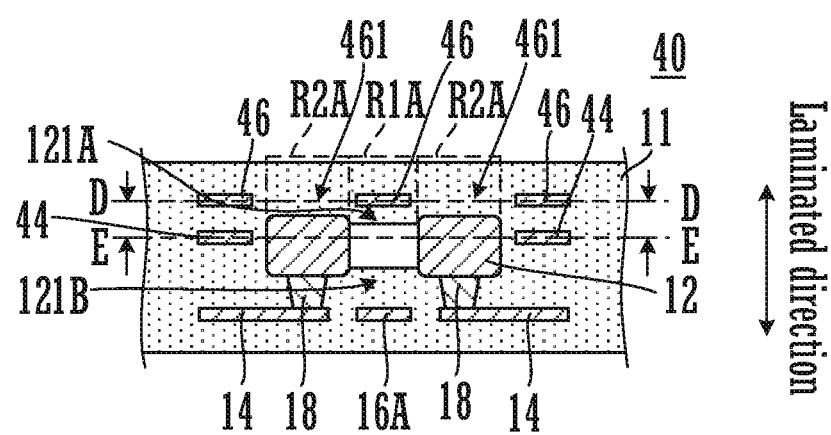
FIG. 8 is a schematic cross-sectional view illustrating a portion of a component built-in substrate according to a preferred third embodiment of the present invention.
Figure 9A:
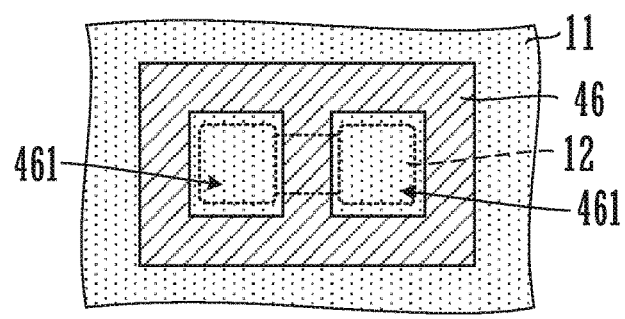
FIG. 9A is a schematic D-D cross-sectional view illustrating a positional relation between the chip capacitor 12 and an isolated conductor 46.
Figure 9B:
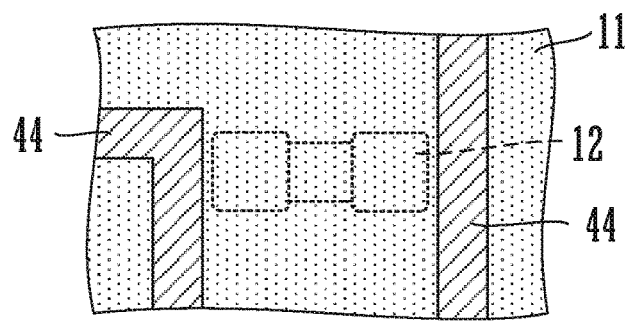
FIG. 9B is a schematic E-E cross-sectional view illustrating a positional relation between the chip capacitor 12 and a circuit wiring conductor 44.

FIG. 8 is a schematic cross-sectional view illustrating a portion of a component built-in substrate 40 according to the third preferred embodiment. FIG. 9A is a schematic D-D cross-sectional view illustrating a positional relationship between the chip capacitor 12 and an isolated conductor 46. FIG. 9B is a schematic E-E cross-sectional view illustrating a positional relationship between the chip capacitor 12 and a circuit wiring conductor 44. In addition, in FIG. 9B, the chip capacitor 12 is not illustrated, and only the position of the chip capacitor 12 is illustrated by a broken line. The isolated conductor 46 is provided near the uneven portion 121A of the chip capacitor 12. The isolated conductor 46 includes a portion overlapping the recessed portion 122A (refer to FIG. 2B) of the chip capacitor 12 in the planar view, and a portion surrounding the chip capacitor 12 along a periphery thereof in the planar view. The isolated conductor 46 is integrally formed and provided in the region R1A and along a periphery of the region R2A such that the isolated conductor 46 surrounds the region R2A when viewed in the lamination direction. The isolated conductor 46 has a rectangular or substantially rectangular shape in the planar view. The isolated conductor 46 is disposed around the chip capacitor 12 in the planar view. The isolated conductor 46 has a rectangular or substantially rectangular opening 461 in the region overlapping the projected portion 123A of the chip capacitor 12 in the planar view. The circuit wiring conductor 44 is provided along the periphery of the chip capacitor 12 in the planar view.

Figure 10:
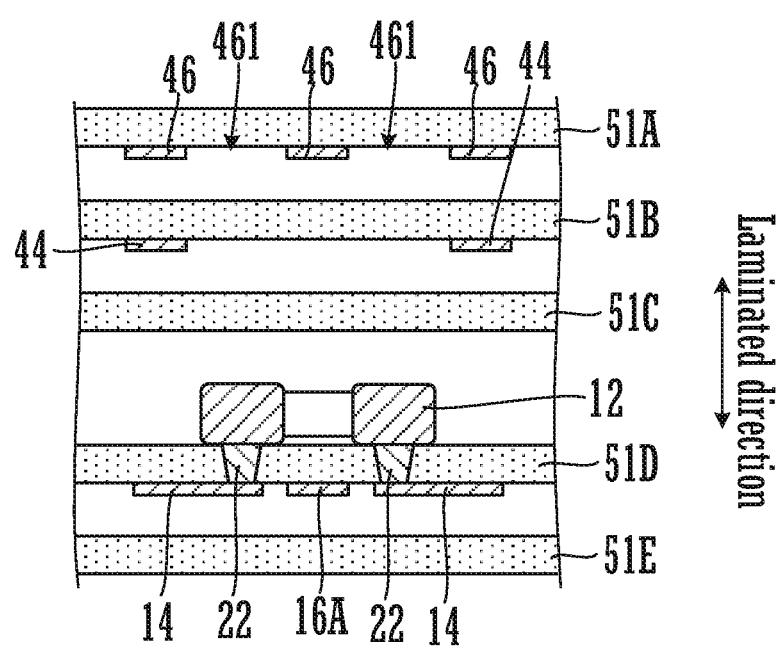
FIG. 10 is a schematic cross-sectional view illustrating a method for manufacturing a component built-in substrate according to the third preferred embodiment of the present invention.
Figure 11:
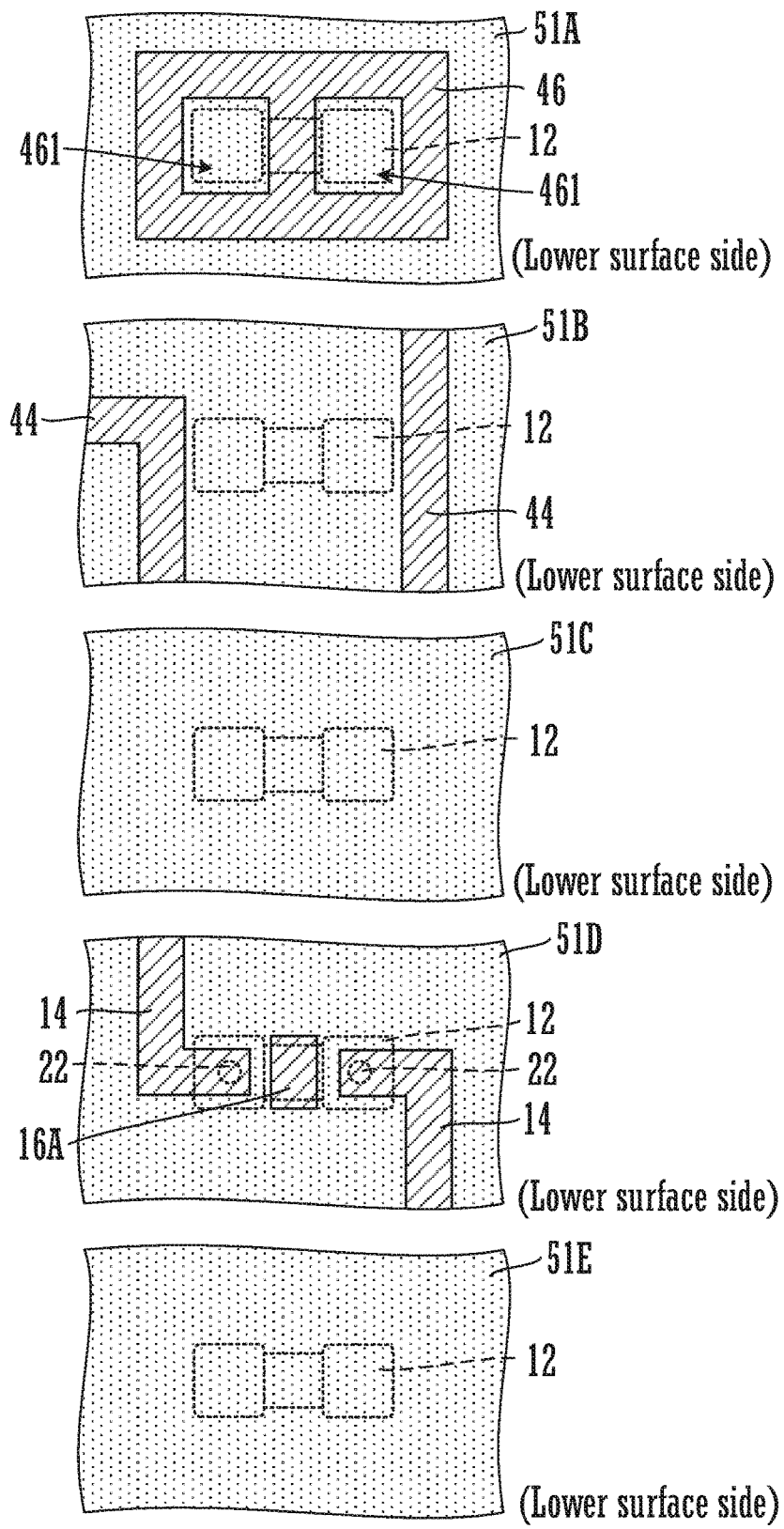
FIG. 11 is a schematic plan view illustrating a portion of base material layers 51A to 51E.

FIG. 10 is a schematic cross-sectional view illustrating a method for manufacturing the component built-in substrate 40. FIG. 11 is a schematic plan view illustrating a portion of base material layers 51A to 51E. In the third preferred embodiment, a base material layer 51D on which the chip capacitor 12 is disposed is heated and pressed simultaneously, such that the chip capacitor 12 is thermocompression-bonded to the base material layer 51D. In a following step, the base material layers 51A to 51E are laminated in this order. The cavity to accommodate the chip capacitor 12 is not formed in the base material layers 51B and 51C. Subsequently, the base material layers 51A to 51E are heated and pressed simultaneously, such that the base material layers 51A to 51E are thermocompression-bonded to each other. Through the above steps, the component built-in substrate 40 incorporating the chip capacitor 12 is completed as illustrated in FIG. 8.

In the third preferred embodiment, the isolated conductor 46 and the circuit wiring conductor 44 are provided along the periphery of the chip capacitor 12 in the planar view. Therefore, even when the cavity to accommodate the chip capacitor 12 is not provided, the space to accommodate the chip capacitor 12 is ensured by the thicknesses of the isolated conductor 46 and circuit wiring conductor 44. As a result, it is easy to hot-press the laminated base material layers 51A to 51E such that both of the main surfaces of the multilayer substrate 11 are flat or substantially flat. Therefore, without the need to perform the step of forming the cavity, both of the main surfaces of the component built-in substrate 40 are flat or substantially flat.

Fourth Preferred Embodiment

A component built-in substrate according to a fourth preferred embodiment of the present invention will be described. In the component built-in substrate according to the fourth preferred embodiment, a chip capacitor is thicker than the chip capacitor 12 (refer to FIG. 8) in the third preferred embodiment. Other configurations of the component built-in substrate in the fourth preferred embodiment are similar to the configurations of the component built-in substrate 40.

Figure 12:
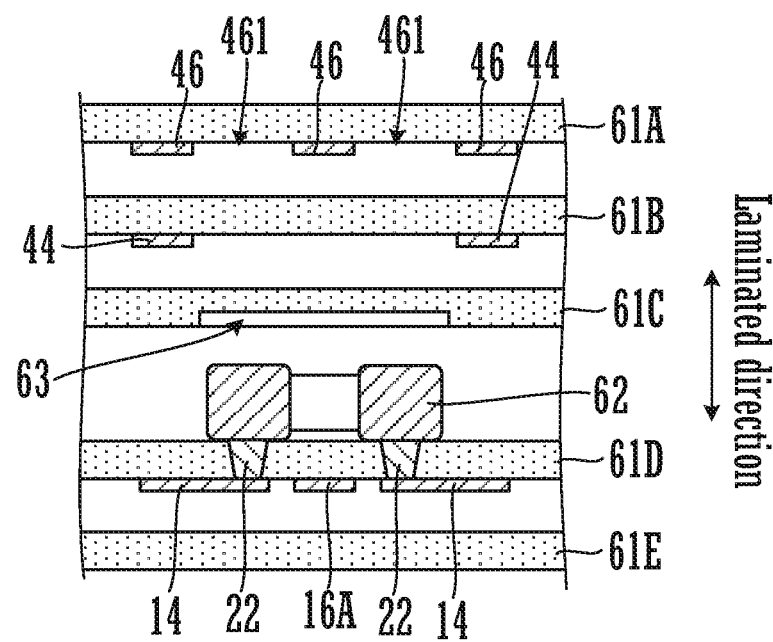
FIG. 12 is a schematic cross-sectional view illustrating a method for manufacturing a component built-in substrate according to a fourth preferred embodiment of the present invention.

FIG. 12 is a schematic cross-sectional view illustrating a method for manufacturing the component built-in substrate according to the fourth preferred embodiment. In the fourth preferred embodiment, a bottom hole 63 is formed in a base material layer 61C. The bottom hole 63 of the base material layer 61C is formed to overlap a chip capacitor 62 in the planar view when base material layers 61A to 61E are laminated. Then, a base material layer 61D on which the chip capacitor 62 is disposed is heated and pressed simultaneously, such that the chip capacitor 62 is thermocompression-bonded to the base material layer 61D. In a following step, the base material layers 61A to 61E are laminated in this order such that the chip capacitor 62 fits into the bottom hole 63 of the base material layer 61C. Subsequently, the base material layers 61A to 61E are heated and pressed simultaneously, such that the base material layers 61A to 61E are thermocompression-bonded to each other. Through the above steps, the component built-in substrate incorporating the chip capacitor 62 is completed.

When the chip capacitor is thick, the conductor pattern to ensure the space to accommodate the chip capacitor cannot be sufficiently provided in some cases. According to the fourth preferred embodiment, in addition to providing the isolated conductor 46 and circuit wiring conductor 44, the bottom hole 63 is also provided in the base material layer 61C. Therefore, even when the chip capacitor 62 is thick, the space to accommodate the chip capacitor 12 is ensured. As a result, it is easy to hot-press the laminated base material layers 61A to 61E such that both of the main surfaces of the component built-in substrate are flat or substantially flat.

Furthermore, the "component" of various preferred embodiments of the present invention is not limited to the chip capacitor in the above preferred embodiments, and it may be a chip component such as a chip inductor or a chip battery. Furthermore, the "low fluid member" according to various preferred embodiments of the present invention is not limited to those described in the above preferred embodiments, and it may be a member such as ceramics or a resin with a high melting point.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A component built-in substrate comprising:
    a low fluid member;
    a component; and
    a multilayer substrate including base material layers made of thermoplastic resin and laminated in a lamination direction; wherein
    the component is disposed in the multilayer substrate and includes an uneven portion including a recessed portion and a projected portion on at least one side of the component in the lamination direction;
    a melting point of the low fluid member is higher than a fluidization temperature of the base material layers;
    on the at least one side of the component, a density of the low fluid member is higher in a first region overlapping the recessed portion of the component than in a second region overlapping the projected portion of the component when viewed in the lamination direction;
    the low fluid member includes a conductor pattern facing the component across at least one of the base material layers;
    the conductor pattern includes a ground conductor;
    the ground conductor does not overlap the projected portion of the component when viewed in the lamination direction; and
    the ground conductor overlaps the recessed portion of the component when viewed in the lamination direction.

2. The component built-in substrate according to claim 1, wherein on the at least one side of the component, at least a portion of the low fluid member is located in the first region and is closer to the component than to a main surface of the multilayer substrate.

3. The component built-in substrate according to claim 1, wherein the conductor pattern includes an isolated conductor.

4. The component built-in substrate according to claim 3, wherein the isolated conductor includes an opening that overlaps the projected portion in the lamination direction.

5. The component built-in substrate according to claim 1, wherein the conductor pattern is integrally provided in the first region and along a periphery of the second region to surround the second region when viewed in the lamination direction.

6. The component built-in substrate according to claim 1, wherein
    the component includes another uneven portion on another side of the component in the lamination direction; and
    on the another side of the component, the density of the low fluid member is higher in the first region than in the second region.

7. The component built-in substrate according to claim 1, wherein
    the low fluid member in each of the first region and the second region is a conductor pattern;
    on the at least one side of the component, a number of the laminated base material layers in the first region is equal to or substantially equal to a number of the laminated base material layers in the second region; and
    on the at least one side of the component, a difference between a total value of thickness of the low fluid member in the lamination direction in the first region, and a total value of thickness of the low fluid member in the lamination direction in the second region is equal to, substantially equal to, or less than a step difference of the uneven portion of the component.

8. The component built-in substrate according to claim 7, wherein on a main surface of the multilayer substrate on the at least one side of the component, an external electrode is provided in a position overlapping the component when viewed in the lamination direction.

9. A component built-in substrate comprising:
    a low fluid member;
    a component; and
    a multilayer substrate including base material layers made of thermoplastic resin and laminated in a lamination direction; wherein
    the component is disposed in the multilayer substrate and includes an uneven portion including a recessed portion and a projected portion on at least one side of the component in the lamination direction;
    a melting point of the low fluid member is higher than a fluidization temperature of the base material layers;
    on the at least one side of the component, a density of the low fluid member is higher in a first region overlapping the recessed portion of the component than in a second region overlapping the projected portion of the component when viewed in the lamination direction;
    the low fluid member includes a conductor pattern facing the component across at least one of the base material layers;
    the conductor pattern includes an isolated conductor; and
    the isolated conductor includes an opening that overlaps the projected portion in the lamination direction.

10. The component built-in substrate according to claim 9, wherein on the at least one side of the component, at least a portion of the low fluid member is located in the first region and is closer to the component than to a main surface of the multilayer substrate.

11. The component built-in substrate according to claim 9, wherein the conductor pattern includes a ground conductor.

12. The component built-in substrate according to claim 9, wherein the conductor pattern is integrally provided in the first region and along a periphery of the second region to surround the second region when viewed in the lamination direction.

13. The component built-in substrate according to claim 9, wherein
    the component includes another uneven portion on another side of the component in the lamination direction; and
    on the another side of the component, the density of the low fluid member is higher in the first region than in the second region.

14. The component built-in substrate according to claim 9, wherein
- the low fluid member in each of the first region and the second region is a conductor pattern;
- on the at least one side of the component, a number of the laminated base material layers in the first region is equal to or substantially equal to a number of the laminated base material layers in the second region; and
- on the at least one side of the component, a difference between a total value of thickness of the low fluid member in the lamination direction in the first region, and a total value of thickness of the low fluid member in the lamination direction in the second region is equal to, substantially equal to, or less than a step difference of the uneven portion of the component.

15. The component built-in substrate according to claim 14, wherein on a main surface of the multilayer substrate on the at least one side of the component, an external electrode is provided in a position overlapping the component when viewed in the lamination direction.

\* \* \* \* \*